(12) United States Patent
Kim et al.

(10) Patent No.: US 6,680,511 B2
(45) Date of Patent: Jan. 20, 2004

(54) INTEGRATED CIRCUIT DEVICES PROVIDING IMPROVED SHORT PREVENTION

(75) Inventors: Hyoung-Joon Kim, Seoul (KR); Young-Wook Park, Gyeonggi-do (KR); Byeong-Yun Nam, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/052,721

(22) Filed: Jan. 18, 2002

(65) Prior Publication Data

US 2002/0096711 A1 Jul. 25, 2002

(30) Foreign Application Priority Data

Jan. 19, 2001 (KR) ............................ 2001-3066

(51) Int. Cl.⁷ ............................................. H01L 29/76
(52) U.S. Cl. .................... 257/332; 257/387; 438/270; 438/271
(58) Field of Search ................... 257/332, 387; 438/270, 271

(56) References Cited

U.S. PATENT DOCUMENTS

| | | | | |
|---|---|---|---|---|
| 5,262,352 A | * | 11/1993 | Woo et al. | 438/625 |
| 5,591,670 A | * | 1/1997 | Park et al. | 438/586 |
| 5,994,192 A | * | 11/1999 | Chen | 438/303 |
| 6,001,719 A | * | 12/1999 | Cho et al. | 438/592 |
| 6,117,733 A | * | 9/2000 | Sung et al. | 438/265 |
| 6,235,621 B1 | * | 5/2001 | Jeng et al. | 438/592 |
| 6,331,478 B1 | * | 12/2001 | Lee et al. | 438/592 |
| 6,437,411 B1 | * | 8/2002 | Choi et al. | 257/413 |
| 6,448,140 B1 | * | 9/2002 | Liaw | 438/279 |

FOREIGN PATENT DOCUMENTS

JP 9-97880 4/1997

OTHER PUBLICATIONS

Klaus et al., *Atomic Layer Deposition of $SiO_2$ Using Catalyzed and Uncatalyzed Self–Limiting Surface Reactions,* Surface Review and Letters, vol. 6, Nos. 3 & 4, 1999, pp. 435–448.

* cited by examiner

Primary Examiner—David Nelms
Assistant Examiner—Andy Huynh
(74) Attorney, Agent, or Firm—Myers Bigel Sibley & Sajovec PA

(57) ABSTRACT

The present invention provide integrated circuit devices and methods of fabricating the same that include a microelectronic substrate and a conductive layer disposed on the microelectronic substrate. An insulating layer is disposed on the conductive layer and the insulating layer includes an overhanging portion that extends beyond the conductive layer. A sidewall insulating region is disposed laterally adjacent to a sidewall of the conductive layer and extends between the overhanging portion of the insulating layer and the microelectronic substrate.

18 Claims, 19 Drawing Sheets

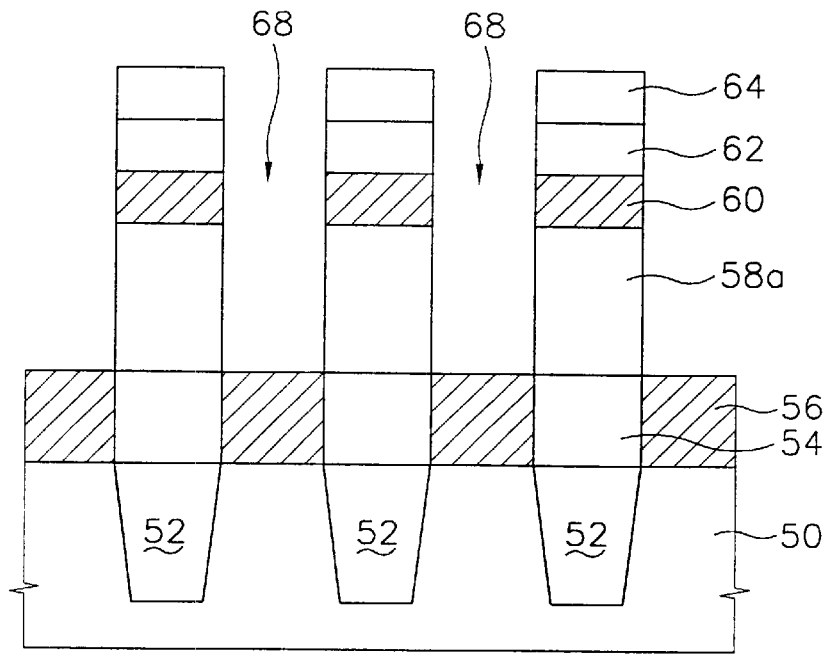
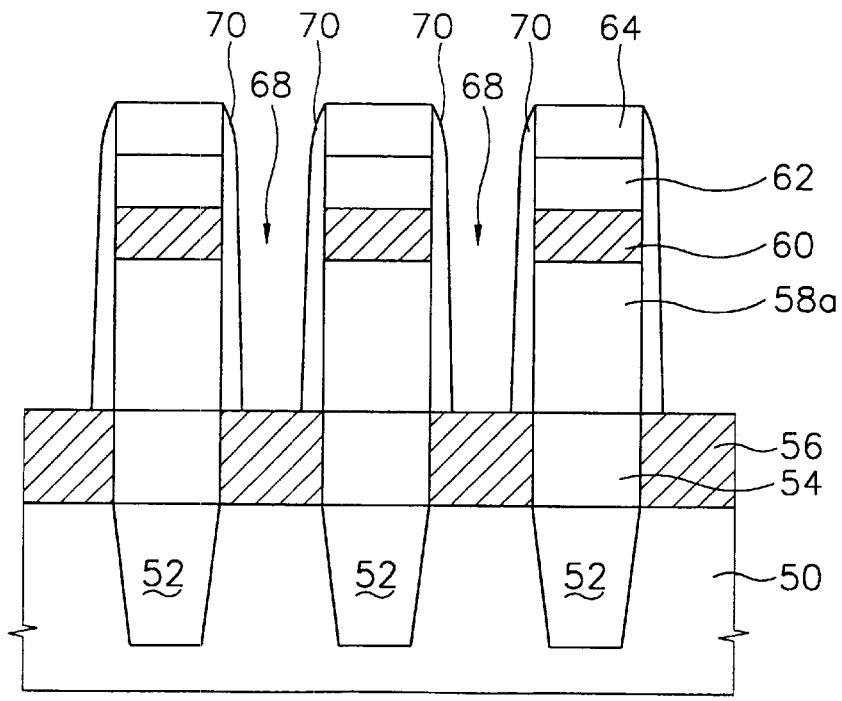

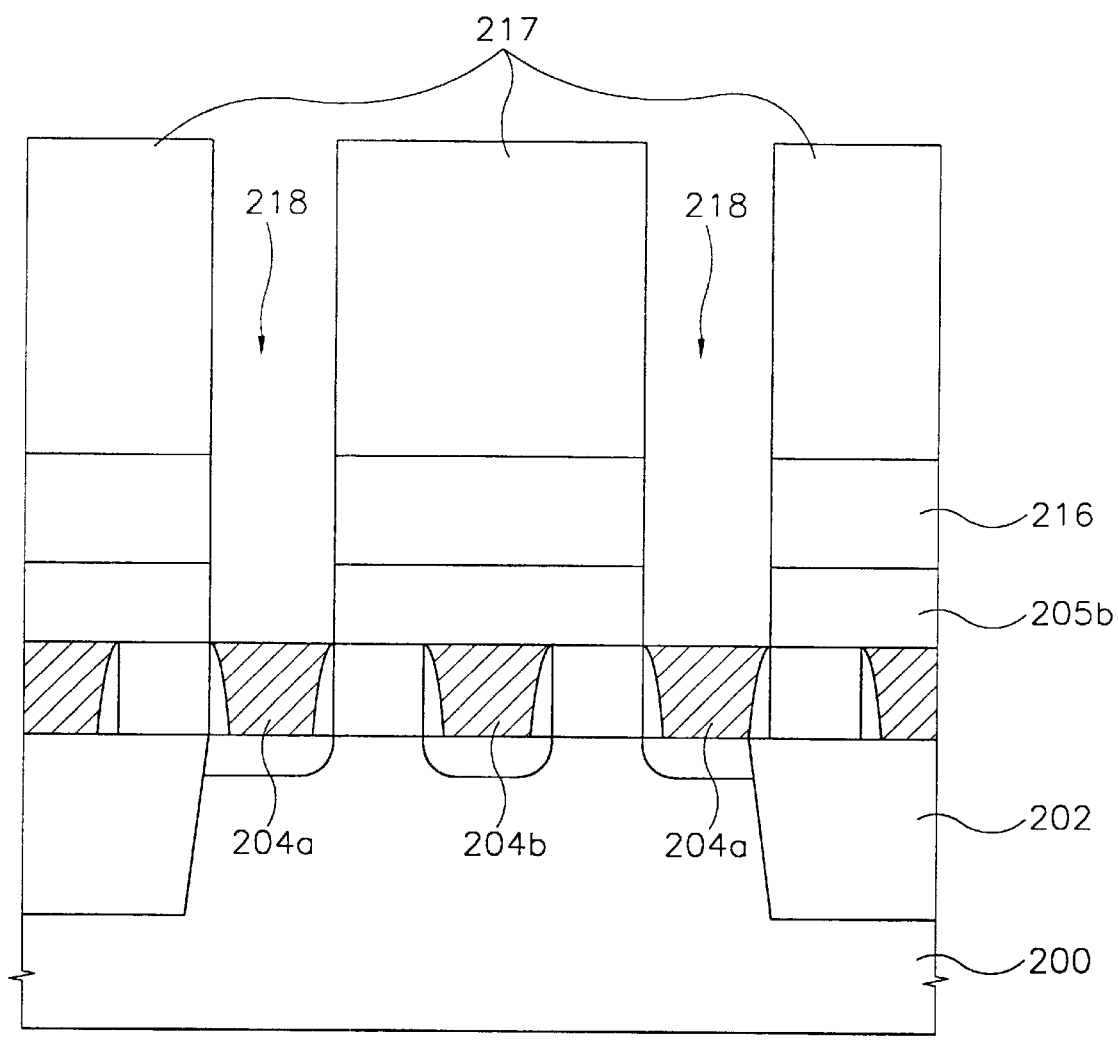

INTEGRATED CIRCUIT DEVICES PROVIDING IMPROVED SHORT PREVENTION

RELATED APPLICATION

This application is related to Korean Application No. 2001-3066, filed Jan. 19, 2001, the disclosure of which is hereby incorporated herein by reference.

FIELD OF THE INVENTION

The present invention relates to integrated circuit devices and methods of fabricating the same and, more particularly, to integrated circuit devices having self aligned contacts and methods of fabricating the same.

BACKGROUND OF THE INVENTION

As integrated circuit devices decrease in size, the space available for wiring the device and a space between wirings within the device also decrease. For example, in order to form a contact that connects isolated device areas to each other through a highly conductive thin film, an aligning margin and a device isolation margin are typically utilized, thus a relatively large space is conducive to forming the integrated circuit device.

In a memory device, such as a Dynamic Random Access Memory (DRAM), the size of the contact is a factor used to determine the size of the memory cell. Recently, a manufacturing technique has been developed for manufacturing integrated circuit devices having a size of, for example, less than about 0.25 $\mu$m. It is typically difficult to form a fine contact using conventional fabrication methods. Furthermore, in memory devices having a plurality of conductive layers, the spacing between conductive layers is typically increased by the presence of an insulating layer interposed therebetween, thus possibly making it difficult to form the contact between the conductive layers. Therefore, in memory cells having a compact design and repeating patterns, self-aligned contacts are typically used to reduce the cell area.

A self-aligned contact is typically formed using step differences of peripheral structures. Various contacts may be obtained without using a mask by using the height of the peripheral structure, the thickness of an insulation film in a predetermined area where the contact is formed, and an etching method. A possible advantage of the self-aligned contact technique is that a fine contact can be formed without an aligning margin. A conventional self-aligned contact technique typically has a contact hole that is formed using an anisotropic etching process using an etching selectivity between an oxide film and a nitride film.

Now referring to FIGS. 1A and 1B, cross-sectional views of conventional integrated circuits having self-aligned contacts will be discussed below. Referring to FIG. 1A, a MOS transistor (not shown) is formed on an microelectronic substrate 10 having an active area defined by a field oxide film 12. A first insulating layer 14 consisting of silicon oxide is formed by depositing silicon oxide on the surface of the microelectronic substrate 10. A conductive layer for a bit line BL and a second insulating layer consisting of silicon nitride are deposited on the first insulating layer 14. A photolithography process is carried out for patterning the second insulating layer and the conductive layer, so that bit line structures BL consisting of a second insulation film pattern 18 and a bit line 16 are formed. Silicon nitride is deposited on the surface of the resulting structure thereby forming a silicon nitride layer. The silicon nitride layer is anisotropically etched so as to form a spacer 20 consisting of silicon nitride on the sidewalls of the bit line structure BL.

Now referring to FIG. 1B, a third insulating layer 22 consisting of silicon oxide is formed by depositing silicon oxide on the surface of the resulting structure. A photoresist pattern (not shown) is formed in such a manner that a contact hole larger than the space between the bit line structures BL can be defined. The third insulating layer 22 is etched by an anisotropic etching process using the etching selectivity between a silicon oxide film and a silicon nitride film, thereby forming a storage node contact hole 24 for exposing a substrate area between the bit line structures BL. The photoresist pattern is used as an etching mask. A capacitor electrode (not shown) may be provided to bury the node contact hole 24.

The silicon nitride film may be used as the spacer 20, which is formed at the sidewall of the bit line structure BL, and the silicon oxide film may be used as the third insulating layer 22. However, since the bond energy of the silicon oxide film may be greater than the bond energy of the silicon nitride film, it may be difficult to increase the etching selectivity between the silicon oxide film and the silicon nitride film as the size of the storage node contact hole 24 decreases.

Typically, a predetermined space is provided between the bit line structures BL, i.e. storage node contact hole 24, by using the self-aligned contact process. If the width of the sidewall spacer 20 is reduced to increase the spacing, the sidewall spacer 20 may be consumed during the etching process for forming the self-aligned contact. Thus, a short may occur. Alternatively, if the width of the sidewall spacer 20 is increased, it may be difficult to bury a gap formed between the bit line structures BL as discussed above.

In addition, the sidewall spacer 20, consisting of silicon nitride, typically has a dielectric constant above 7. Thus, the parasitic capacitance between the bit lines may be twice the parasitic capacitance of the conventional contact structure in which the bit line is insulated from the storage electrode by using the silicon oxide film having the dielectric constant of 3.9.

Recently, to address the short comings of existing conventional structures, a method for forming the sidewall spacer in the contact hole after forming the self-aligned contact while preventing a short between the storage electrode and the bit line has been discussed. For example, this method is discussed in Japanese Patent No. JP9097880A2 entitled Semiconductor Storage Device and Its Manufacture to Hirosuke et al.

Now referring to FIGS. 2A and 2B, cross-sectional views of integrated circuits illustrating the method for manufacturing a DRAM cell disclosed in the above referenced Japanese Patent will be discussed. A field oxide film 52 is formed on a microelectronic substrate 50 by using a shallow trench isolation (STI) technique. A conventional MOS transistor manufacturing process is carried out so as to form a MOS transistor consisting of a gate region and a source/drain region on the surface of the substrate 50.

Silicon oxide is deposited on the surface of the microelectronic substrate 50 forming a silicon oxide film 54. A contact hole for exposing the source/drain region is formed by using a self-aligned contact process. A pad electrode 56 for burying the contact hole is formed at the same height as the gate. Silicon oxide is deposited on the surface of the resulting structure, thereby forming a first insulating layer 58.

A conductive layer for a bit line, a second insulating layer consisting of silicon oxide, and a third insulating layer consisting of silicon nitride are sequentially formed on the first insulating layer 58. The third insulating layer, the second insulating layer and the conductive layer are subject to a photolithography process, so that bit line structures BL consisting of a third insulating layer pattern 64, a second insulating layer pattern 62 and a bit line 60 are formed.

Referring now to FIG. 2B, a fourth insulating layer 66 is formed by depositing silicon oxide on the resulting structure. The fourth insulating layer 66 is planarized by performing a chemical mechanical polishing (CMP) process. The third insulation pattern 64 may be used as a stopper.

Referring now to FIG. 2C, the fourth insulating layer 66 is etched using the high etching selectivity between the silicon oxide film and the silicon nitride film. The first insulating layer 58 formed on the pad electrode 56 is simultaneously etched so that a first insulating layer pattern 58a is formed. At the same time, a storage node contact hole 68, which is self-aligned with respect to the bit line structure BL, is formed.

Referring now to FIG. 2D, a thin silicon oxide film is formed by depositing silicon oxide on the surface of the resulting structure. The silicon oxide film is anisotropically etched so that a spacer 70 is formed in the storage node contact hole 68. A storage electrode (not shown) of a capacitor for burying the storage node contact hole 68 may be formed.

The conventional method discussed with respect to FIGS. 2A through 2D may address some of the problems discussed with respect to the methods and devices of FIGS. 1A through 1B. For example, the gap burying problem caused by the spacer 70 may be improved by forming spacer 70 after forming the storage node contact hole 68 and the increase in the parasitic capacitance between the bit lines 60 may be improved by fabricating the spacer 70 using a silicon oxide film having a low dielectric constant. However, if the bit line structure BL has an inclined profile, the height of the spacer 70 may be lowered, thus, a part of the bit line 60, i.e. an upper end portion of the bit line 60 may be exposed, thus, a short may occur between the bit line 60 and the storage electrode.

SUMMARY OF THE INVENTION

Embodiments of the present invention provide integrated circuit devices that include a microelectronic substrate and a conductive layer disposed on the microelectronic substrate. An insulating layer is disposed on the conductive layer and the insulating layer includes an overhanging portion that extends beyond the conductive layer. A sidewall insulating region is disposed laterally adjacent to a sidewall of the conductive layer and extends between the overhanging portion of the insulating layer and the microelectronic substrate.

Some embodiments of the present invention may further include an insulating region disposed between the overhanging portion of the insulating layer and the microelectronic substrate and a sidewall spacer conforming to a sidewall of the insulating layer, the sidewall insulating region and an adjoining surface of the insulating region.

In further embodiments of the present invention the overhanging portion may extend a distance of from about 10 Å to about 100 Å beyond the conductive layer. The sidewall insulating region may extend from the sidewall of the conductive layer to the sidewall of the insulating layer. The conductive layer may include first and second metallic layers. The first metallic layer may include titanium (Ti) and the second metallic layer may include tungsten (W).

BRIEF DESCRIPTION OF THE DRAWINGS

FIGS. 2A through 2D are cross-sectional views of a portion of a substrate of another conventional integrated circuit device having a self-aligned contact;

DETAILED DESCRIPTION OF THE INVENTION

Figure 1A:
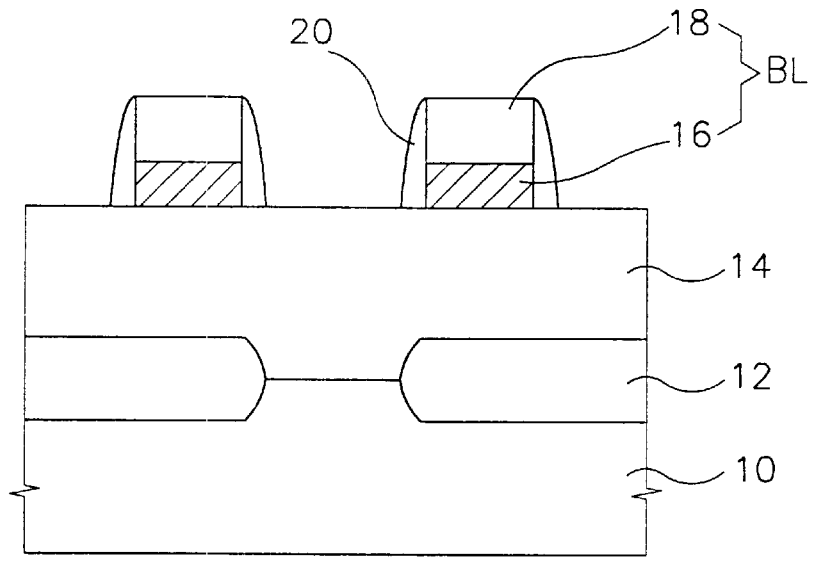
FIGS. 1A and 1B are cross-sectional views of a portion of a substrate of a conventional integrated circuit devices having a self-aligned contact.
Figure 1B:
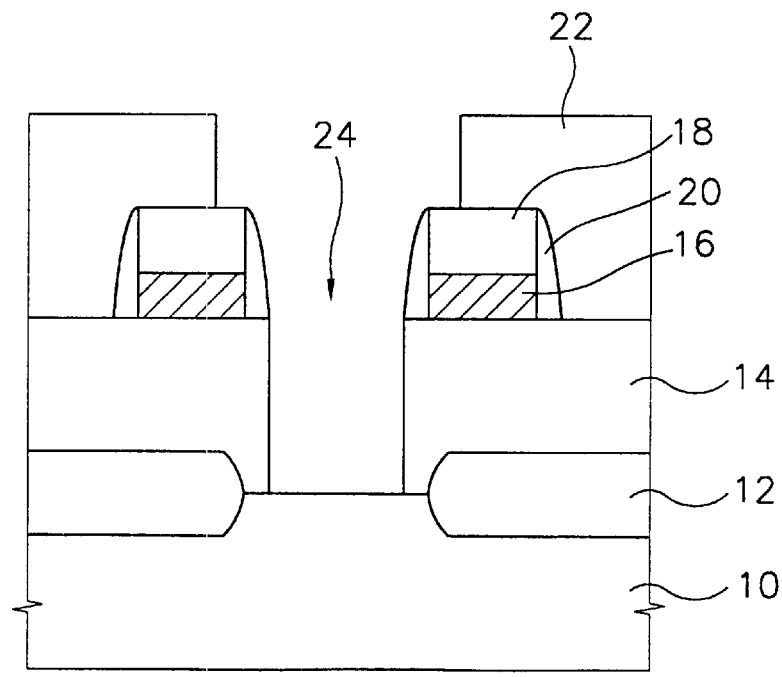
Figure 2A:
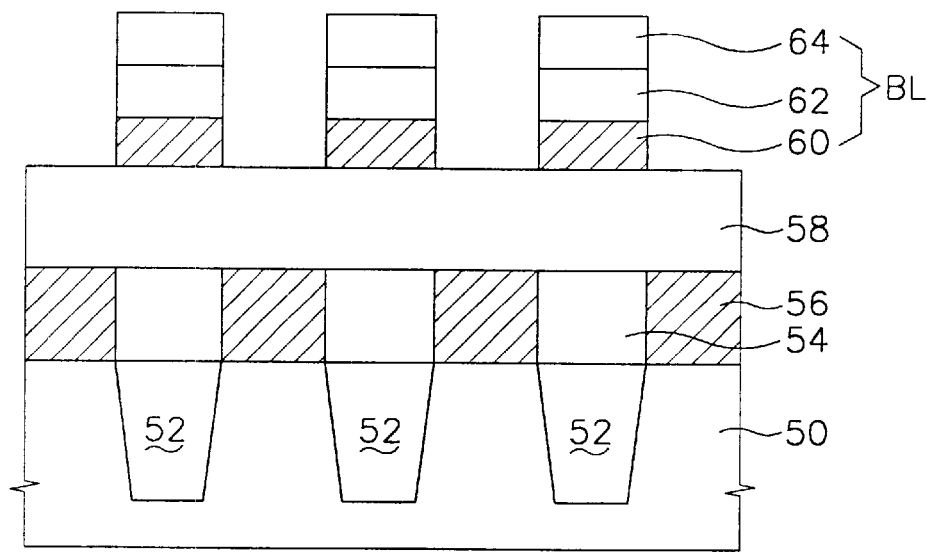
Figure 2B:
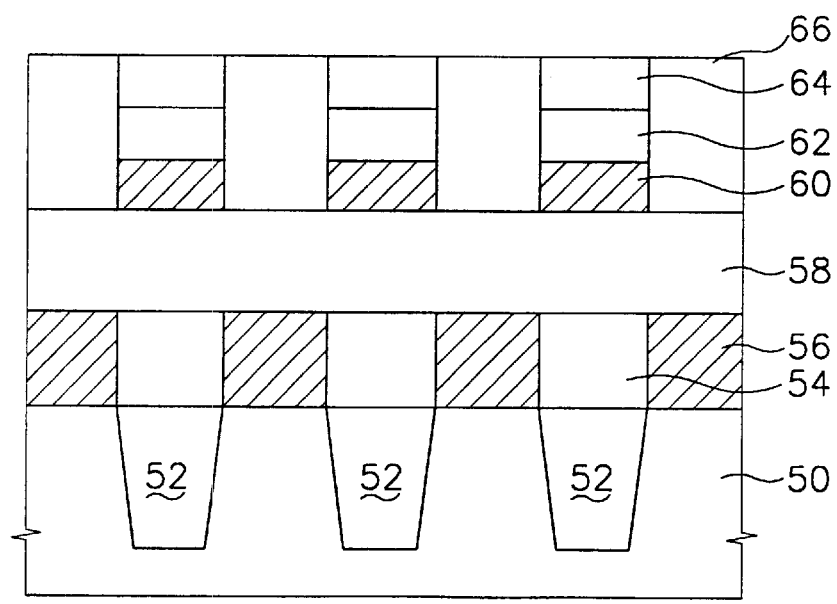

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. In contrast, when an element is referred to as being "directly on" another element, there are no intervening elements present. Like reference numerals refer to like elements throughout.

Embodiments of the present invention will now be described in detail below with reference to FIGS. 3A through 13B, which illustrate various embodiments of the present invention and various processes of fabricating embodiments of the present invention. An integrated circuit device is provided having an insulating layer that includes an overhanging portion that extends beyond the conductive layer. A sidewall insulating region, i.e. insulating layer residue, is disposed laterally in the space between the overhanging portion of the insulating layer and the microelectronic substrate. Accordingly, this sidewall insulating region may reduce the possibility that the conductive layer will be exposed and cause a short when the contact hole is etched Now referring to FIGS. 3A through 3E, cross-sectional views of integrated circuits according to embodiments of the present invention illustrating fabrication methods of the same will be discussed. A first insulating layer 102 is formed on an microelectronic substrate 100, a conductive layer 107 is formed on the first insulating layer 102, and a second insulating layer 108 is formed on the conductive layer 107. The first insulating layer 102 may be formed by, for example, depositing silicon oxide based materials on the microelectronic substrate 100. The conductive layer 107 may include, for example, a first layer 104 and a second layer 106. The first layer 104 may include, for example, a first metal and a compound of the first metal, such as titanium/titanium nitride (Ti/TIN). The second layer 106, may include, a second metal, such as tungsten (W). The second insulating layer 108 may be formed, for example, using a silicon nitride based material. Alternatively, the second insulating layer 108 may be a composite layer having a silicon nitride based material and a silicon oxide based material.

Before forming the conductive layer 107, the first insulating layer 102 may be partially etched via a photolithography process so that a first contact hole (not shown) may be formed for exposing a first lower area of the first insulating layer 102. Thus, the conductive layer 107 is electrically connected to the first lower area of the first insulating layer 102 through the first contact hole.

A contact plug (not shown) having a barrier metal layer and a third metal layer may be formed in the first contact hole, after forming the first contact hole and before forming the conductive layer 107. The contact plug may be formed by depositing the barrier metal layer on the first contact hole and on the first insulating layer 102, depositing the third metal on the barrier metal layer and removing the third metal formed on the first insulating layer 102. The barrier metal layer may include, for example, titanium/titanium nitride (Ti/TIN), and the third metal layer may include, for example, tungsten (W). Optionally, a contact plug may be provided. If a contact plug is provided, the conductive layer 107 may be fabricated in a single layer using a fourth metal, such as tungsten.

Figure 3A:
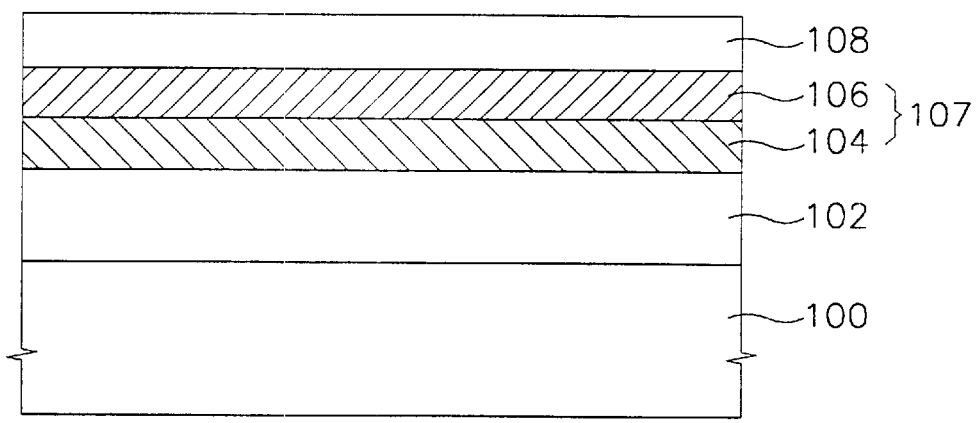
FIGS. 3A to 3E are cross-sectional views of a portion of an integrated circuit device according to embodiments of the present invention illustrating methods fabricating the same.
Figure 3B:
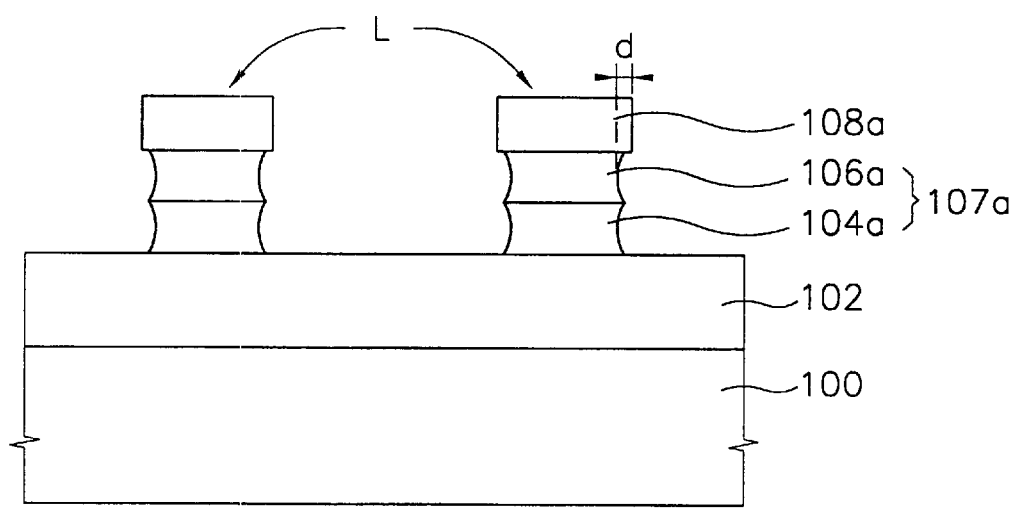

Referring now to FIG. 3B, the second insulating layer 108 and the conductive layer 107 are patterned to form a wiring L. A photoresist is coated on the second insulating layer 108 by, for example, using a spin coating method thereby forming a photoresist film. The photoresist film is subject to a photo process so as to form a first photoresist pattern (not shown). The second insulating layer 108 and the conductive layer 107 are etched to form the wiring L having a second insulating layer pattern 108a and a conductive layer pattern 107a. The first photoresist pattern may be used as an etching mask. The conductive layer pattern 107a is provided having a width that is smaller than a width of the second insulating layer pattern 108a. The width of the conductive layer pattern may be controlled by adjusting an etchant recipe of the conductive layer 107. The conductive layer 107 may include a first layer 104 and a second layer 106. As discussed above, the first layer 104 may include titanium/titanium nitride (Ti/TIN) and the second layer 106 may include tungsten.

The second insulating layer pattern 108a is formed by etching the second insulating layer 108 using an anisotropic etching process. Undercut portions are formed at one or both lower sides of the second insulating layer pattern 108a, for example, by adjusting the etchant recipe of the second layer 106. Thus, as illustrated, the second layer pattern 106a has a width that is narrower than the width of the second insulation pattern 108a by from about 10 to about 100 Å (d). Similarly, the etching recipe of the first layer 104 is controlled so as to form a first layer pattern 104a having a width which is narrower than the width of the second insulating layer pattern 108a by from about 10 to 100 Å (d). Thus, the second insulating layer 108a includes an overhanging portion that extends beyond the conductive layer by from about 10 to about 100 Å (d).

It will be understood that although the widths of the second layer pattern 106a and the first layer pattern 104a are both discussed as being narrower than the second insulating layer pattern by the width d, the present invention is not limited to this configuration. For example, the width of the first layer pattern 104a may be substantially the same as the width of the second layer pattern 106a. Alternatively, the width of the first layer pattern 104a may be substantially different than the width of the second layer pattern 106a. Furthermore, the undercut portion may be formed on one side of the second insulating layer pattern 108a or on both sides of the second insulating layer pattern 108a as illustrated in FIG. 3B. If the undercut portion is formed on both sides of the second insulating layer pattern 108a, the width of the second layer pattern 106a and the width of the first layer pattern 104a are smaller than the width of the second insulating layer pattern 108a by 2d.

Figure 3C:
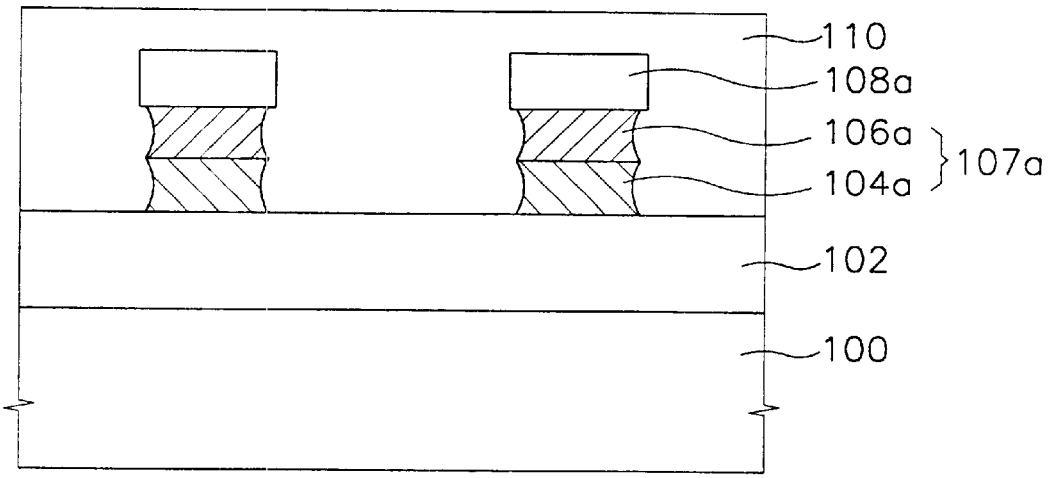

Referring now to FIG. 3C, a third insulating layer 110 is formed on the second insulating layer pattern 108a. The first photoresist pattern is removed by, for example, performing ashing and stripping processes. Silicon oxide based materials are deposited on the surface of the resulting structure with wirings L formed thereon, thereby forming a third insulating layer 110. In some embodiments of the present invention, the conductive layer 107 includes tungsten. The third insulating layer 110 may be formed by a high temperature oxide film which is deposited at the high temperature or an oxide film such as Borophosphosilica glass (BPSG) and spin on glass (SOG) which are required to perform a high temperature baking process after the deposition process. In this case, tungsten may be oxidized because the side portion of the conductive layer pattern 107a may be exposed. Accordingly, in order to prevent the tungsten from oxidizing, a deposition process is carried out in a high density plasma (HDP) process, during which material is deposited in a low temperature and a gap is buried without creating voids, thereby forming the third insulating layer 110 consisting of oxide based material.

Figure 3D:
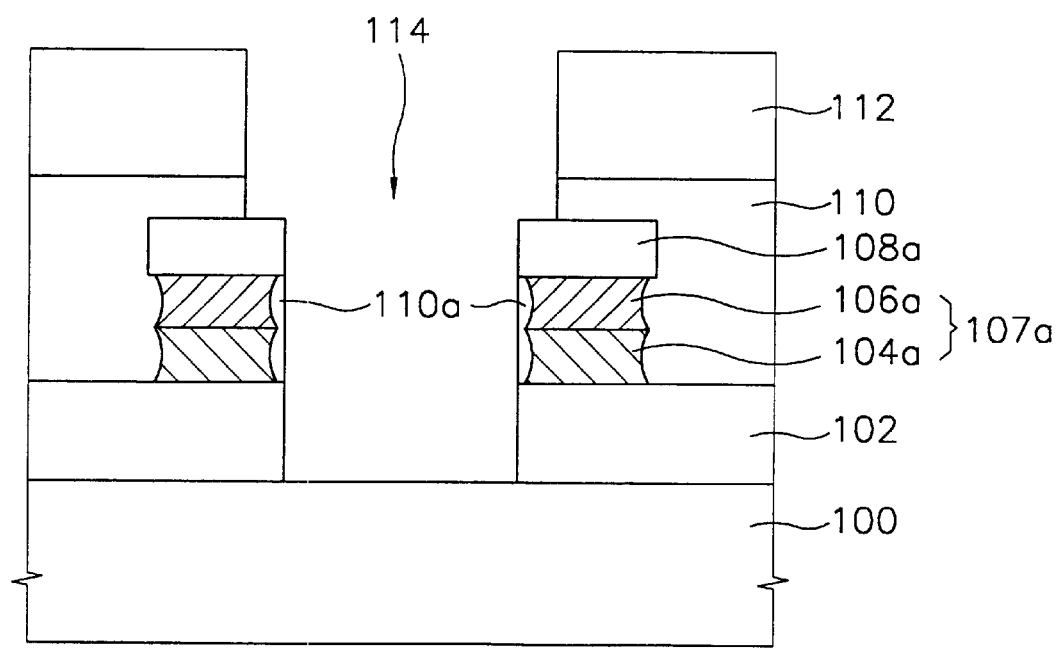

Referring now to FIG. 3D, a contact hole 114 for forming a storage node is formed. A chemical and mechanical polishing process is carried out so as to planarize the surface of the third insulating layer 110. A photoresist is coated on the planarized surface of the third insulating layer 110 thereby forming a photoresist film. A second photoresist pattern 112 for defining a contact hole area is formed by means of a photo process which exposes and develops the photoresist film. The third insulating layer 110 and the first insulating layer 102 are etched using the anisotropic etching process under the etching condition having the high selectivity with respect to the second insulating layer pattern 108a. The second photoresist pattern 112 may be used as an etching mask. The contact hole 114, which is self-aligned with respect to the wirings L, is formed, and a third insulating layer residue 110a, i.e. a sidewall insulating region, having a thickness (d) corresponding to a width difference between the second insulating layer pattern 108a and the conductive layer pattern 107a remains on a sidewall of the conductive layer pattern 107a in the contact hole 114. The third insulating layer residue 110a may reduce the possibility that the sidewall of the conductive layer pattern 107a will be exposed and reduce the current leakage generated in the conductive layer pattern 107a.

Figure 3E:
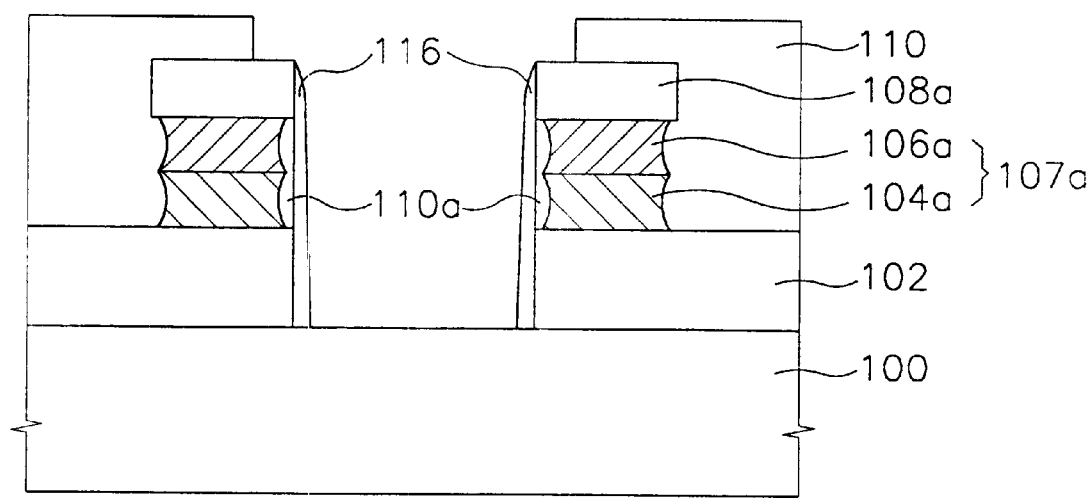

Referring now to FIG. 3E, after removing the second photoresist pattern 112 through ashing and stripping processes, a fourth insulating layer having a thickness of from about 200 to about 700 Å is deposited on the surface of the resulting structure. The fourth insulating layer is formed, for example, by a method disclosed in an article by J. W. Klaus et al entitled *Atomic layer deposition of SiO$_2$* using catalyzed and uncatalyzed self-limiting surface reaction. Surface Review and Letters, Volume 6, Nos. 3 & 4, pages 435–448 (1999). The fourth insulating layer is anisotropically etched so that a sidewall spacer 116 is formed in the contact hole 114 from the fourth insulating layer. The sidewall spacer 116 may include, for example, silicon oxide based material or silicon nitride based material. Alternatively, the sidewall spacer 116 may include a composite layer consisting of silicon oxide based material and silicon nitride based material.

Accordingly, the presence of the third insulating layer residue may reduce the possibility that the conductive layer pattern may be exposed when the contact is etched. In addition, the sidewall spacer formed at the sidewall of the wiring typically is thicker than conventional sidewall spacers due to the third insulating layer, thus, reducing the current leakage.

Figure 4:
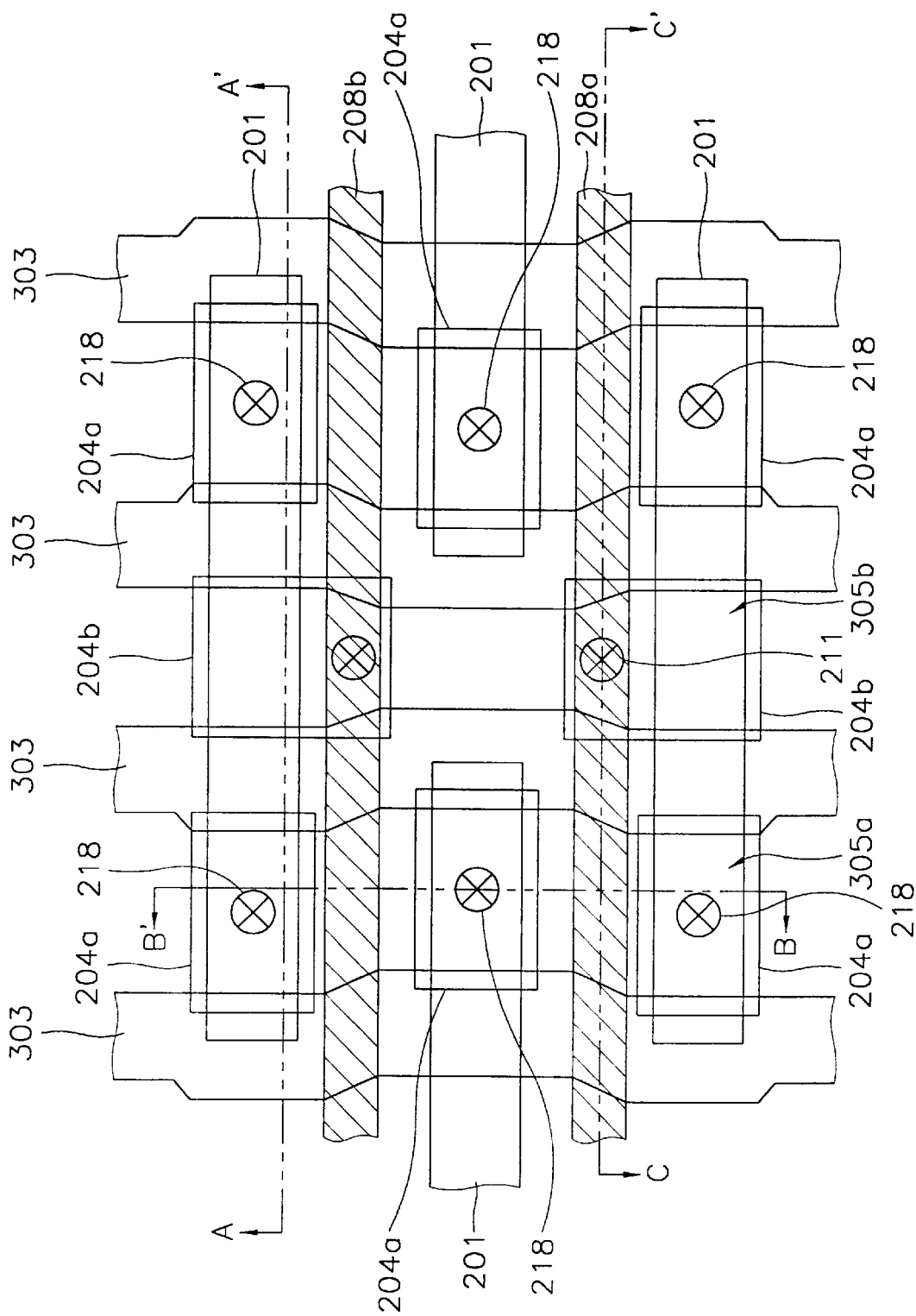
FIG. 4 is a plan view of a Dynamic Random Access Memory (DRAM) cell according to the embodiments of the present invention.
Figure 5:
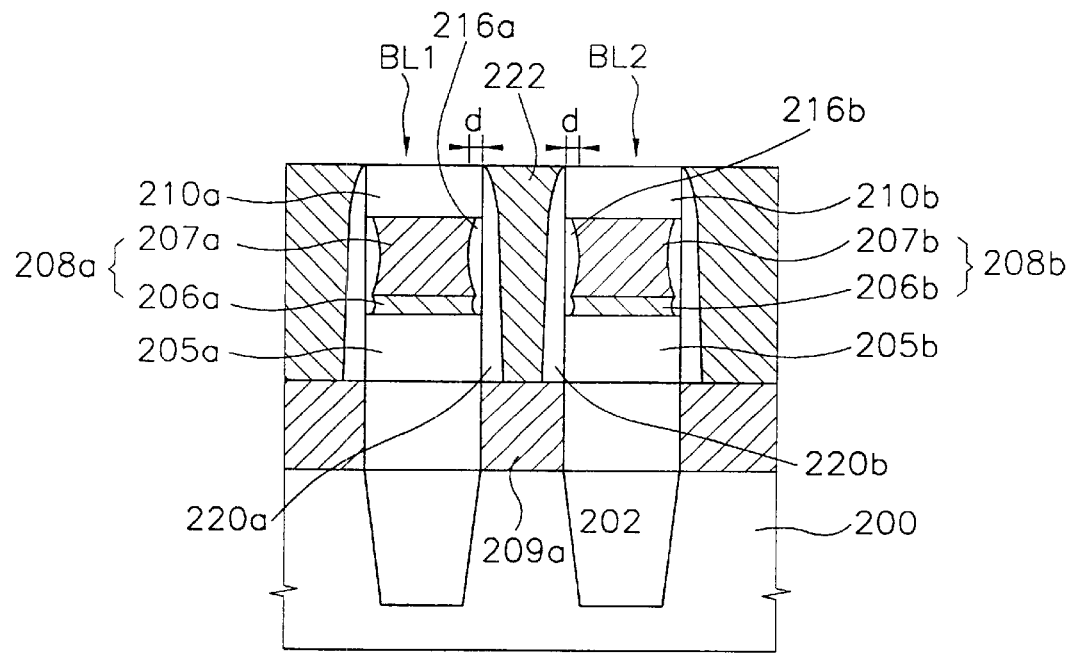
FIG. 5 is a cross-sectional view of the DRAM cell in of FIG. 4 taken along the line B–B'.

Referring now to FIGS. 4 and 5, a plan view of a dynamic Random Access Memory (DRAM) cell of FIG. 4 and a cross-sectional view of the DRAM cell taken along the line B–B' of FIG. 4 in FIG. 5 will be discussed. MOS transistors consisting of a gate electrode 303, which is provided as a word line, a capacitor contact area 305a, i.e. a source region, and a bit line contact area 305b, i.e. a drain region, are provided on an microelectronic substrate 200 in which an active area 201 is defined by a field oxide film 202. First and second pad electrodes 204a and 204b can be formed on source/drain regions 305a and 305b of the MOS transistors for reducing the aspect ratio of contact holes formed on the source/drain regions 305a and 305b.

A first bit line structure BL1 and a second bit line structure BL2 are formed on the microelectronic substrate 200 including MOS transistors. The first and second bit line structures BL1 and BL2 are typically spaced apart by a predetermined distance and a storage node contact hole 218 is defined therebetween. The storage node contact hole 218 may expose a capacitor contact area, ie., the source region 305a and/or the first pad electrode 204a a making contact with the source region 305a.

As illustrated, the first bit line structure BL1 includes a first pattern 205a of the first insulating layer, a first bit line 208a formed on the first pattern 205a of the first insulating layer, and a first pattern 210a of the second insulating layer. The first pattern 210a of the second insulating layer is formed on the first bit line 208a and typically has a width larger than a width of the first bit line 208a.

Similarly, the second bit line structure BL2 includes a second pattern 205b of the first insulating layer, a second bit line 208b formed on the third pattern 205b of the first insulating layer, and a second pattern 210b of the second insulating layer. The second pattern 210b of the second insulating layer is formed on the second bit line 208b and typically has a width larger than a width of the second bit line 208b.

A first residue 216a, i.e. a sidewall insulating region, of the third insulating layer is provided on a sidewall of the first bit line 208a in the storage node contact hole 218. The first residue 216a of the third insulating may have a thickness (d) corresponding to a width difference between the first pattern 210a of the second insulating layer and the first bit line 208a when measured from a center of the first bit line 208a. In other words, the width of the first pattern 210a of the second insulating layer is substantially similar to the sum of the widths of the first bit line 208a and the first residue 216a of the third insulating layer, thus, the sidewall of the first pattern 210a of the second insulating layer can be continuously formed with respect to an outer wall of the first residue 216a of the third insulating layer.

Similarly, a second residue 216b, i.e. a sidewall insulating region, of the third insulating layer on a sidewall of the second bit line 208b in the storage node contact hole 218. The second residue 216b may have a thickness (d) corresponding to the width difference between the second pattern 210b of the second insulating layer and the second bit line 208a. Thus, the width of the second pattern 210b of the second insulating layer is substantially similar to the sum of the widths of the second bit line 208b and the second residue 216b of the third insulating layer formed at both sides of the second bit line 208b, thus, the sidewall of the second pattern 210b of the second insulating layer can be continuously formed with respect to an outer wall of the second residue 216b of the third insulating layer.

A first sidewall spacer 220a is formed on the sidewall of the first residue 216a of the third insulating layer and on the sidewall of the first pattern 205a of the first insulating layer. A second sidewall spacer 220b is formed on the sidewall of the second residue 216b of the third insulating layer and on the sidewall of the third pattern 205b of the first insulating layer.

A capacitor conductive layer 222 may be formed in the storage node contact hole 218. The capacitor conductive layer 222 is typically self-aligned with respect to the bit line structures BL1 and BL2. As illustrated in the figures, the capacitor conductive layer 222 may be provided in the form of a contact plug. Alternatively, the capacitor conductive plug 222 may be patterned with a storage electrode pattern by means of a photolithography process.

Embodiments of the present invention will now be discussed with reference to FIGS. 6A through 13B, which illustrate various cross-sectional views of DRAM cells according to embodiments of the present invention. FIGS. 6A through 13A are cross-sectional views taken along the line A–A' in FIG. 4. FIGS. 6B through 13B are cross-sectional views taken along the line B–B' in FIG. 4.

Figure 6A:
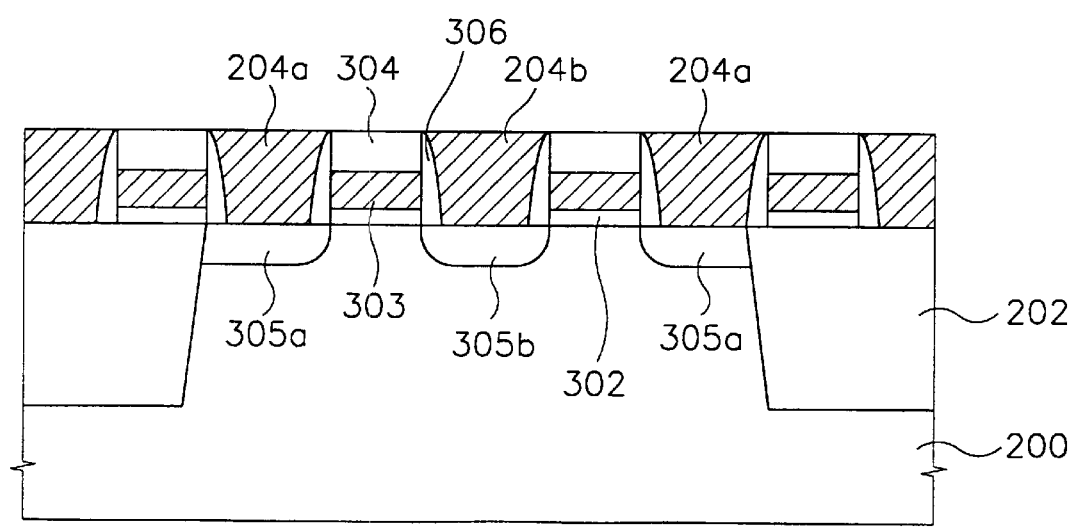
FIGS. 6A through 13B are cross-sectional views of a DRAM cell according to embodiments of the present invention illustrating methods of fabrication the same.
Figure 6B:
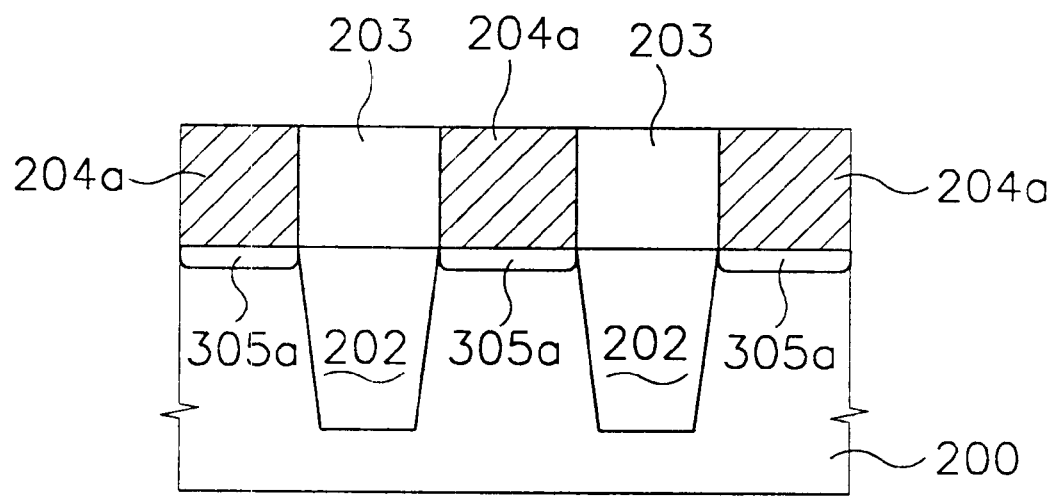

As illustrated in FIGS. 6A and 6B, methods of forming first and second pad electrodes 204a a and 204b will be discussed. The active area (201 of FIG. 4) is defined in the substrate 200 by forming the field oxide film 202 on the surface of the substrate 200 through an isolation process, for example, a shallow trench isolation process.

The MOS transistors are formed in the active area 201 of the substrate 200. After growing a thin gate oxide film 302 on the surface of the active area 201 through a thermal oxidation process, a gate electrode 303 of the MOS transistor, which may act as a word line, is formed on the gate oxide film 302. The gate electrode 303 typically has a stacked polycide structure. The polycide structure may include a polysilicon layer and a tungsten polysilicide layer. High density impurities in the polycide structure are doped using a doping process, such as, for example, a diffusing process, an ion implanting process and/or an in-situ doping process. Furthermore, a silicon nitride film 304 is formed on the gate electrode 303 and a sidewall spacer consisting of silicon nitride is formed on the sidewall of the gate electrode 303. Impurities are implanted into the substrate 200 using the gate electrode 303 as a mask, forming the source/drain regions 305a and 305b of the MOS transistor on the surface of the active area 201.

It will be understood that one of the doping areas is a capacitor contact area making contact with the storage electrode of the capacitor and the other of the doping areas is a bit line contact area making contact with the bit line. For example, the source region 305a may be the capacitor contact area and the drain region 305b may be a bit line contact area.

An insulating layer 303 consisting of, for example, oxide material, such as Borophosphosilica glass (BPSG), is deposited on the surface of the substrate 200. The insulating interlayer 203 is planarized using a chemical-mechanical polishing (CMP) process. The silicon nitride film 304 may be used as a stopper. A contact hole is formed by etching the insulating interlayer 203 using a high etching selectivity between the insulating interlayer 203 and the silicon nitride film 304. The contact hole may be self-aligned with respect to the gate electrode 303.

A polysilicon layer, which is typically highly-doped with impurities, is deposited in the contact hole. The polysilicon layer may be removed to expose the silicon nitride film 304. Accordingly, a first pad electrode 204a a and a second pad electrode 204b are formed in the contact hole. As illustrated, the first pad electrode 204a a contacts the source region 305a and the second pad electrode 204a b contacts the drain region 305b.

Figure 7A:
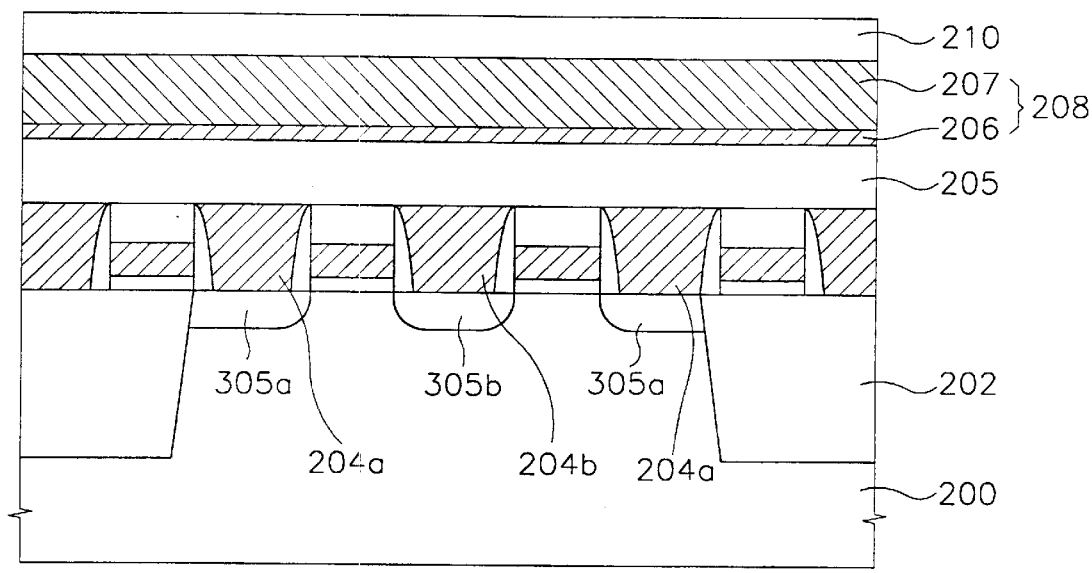
Figure 7B:
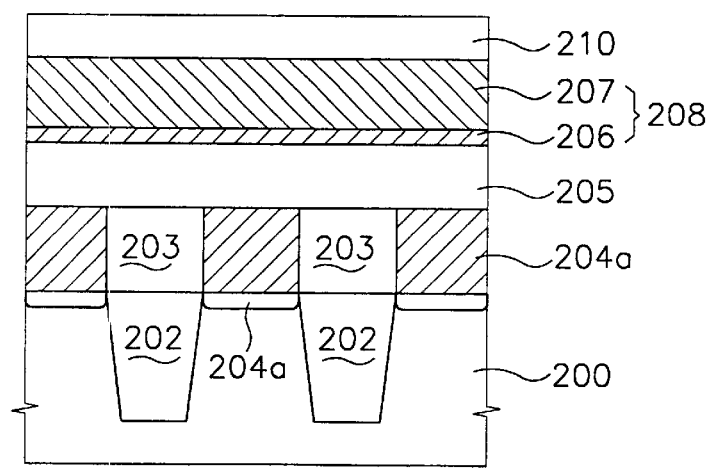
Figure 8A:
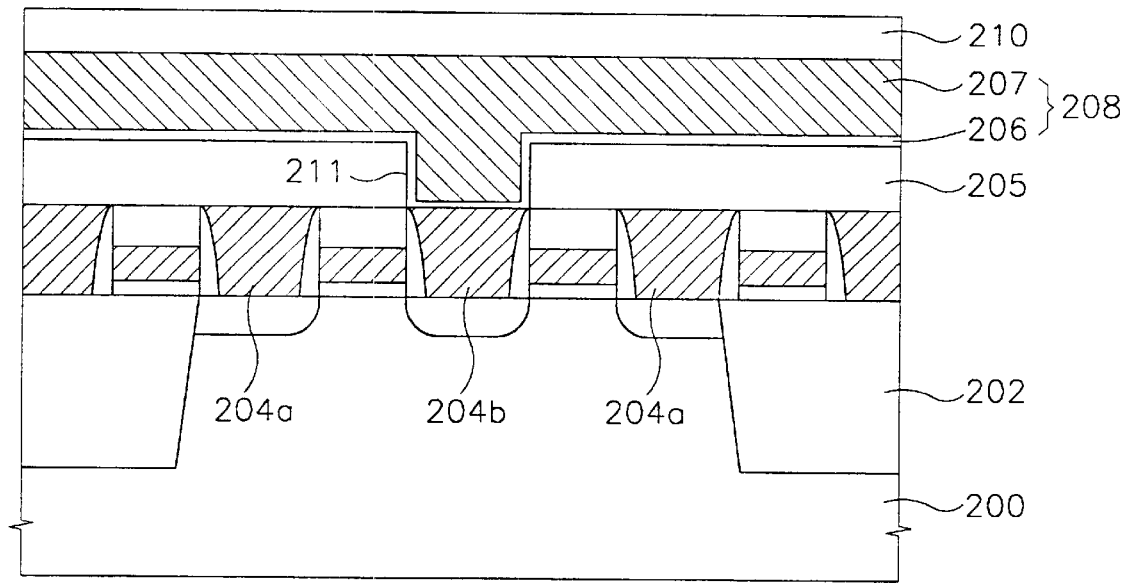

As illustrated in FIGS. 7A and 7B, the first insulating layer 205 is formed on the substrates 200 including the first and second pad electrodes 204a a and 204b. The conductive layer 208 for the bit line is formed on the first insulating layer 205 and the second insulating layer 210 is formed on the conductive layer 208. FIG. 8A illustrates a cross-sectional view taken along the line C–C' of FIG. 4. Referring now to FIGS. 7A, 7B and 8A, the first insulating layer 205 may include, for example, silicon oxide based materials. The first insulating layer 205 is partially etched using, for example, a photolithography process to form a bit line contact hole 211 that may partially or substantially expose the second pad electrode 204b.

A conductive layer 208 for the bit line is deposited on the bit line contact hole 211 and the first insulating layer 205. The bit line conductive layer 208 typically has a first layer 206 and a second layer 207. The first layer 206 may include, for example, a first metal and/or compounds of the first metal, such as Ti/TiN. The second layer 207 may include, for example, a second metal such as tungsten. A second insulating layer 210 is deposited on the conductive layer 208 for the bit line. The second insulating layer 210 may include a silicon nitride based material. Alternatively, the second insulating layer may include a composite layer consisting of silicon oxide based material and silicon nitride based material. The second insulating layer 210 may protect the bit line during the etching process used to form the self-aligned contact.

Accordingly, the bit line conductive layer 208, which typically has first and second layers, may be formed in direct contact with the bit line contact hole 211. Alternatively, a bit line plug can be provided in the bit line contact hole 211 and the bit line conductive layer 208 may be formed in direct contact with the bit line plug. Methods of forming the will be discussed further below with reference to FIG. 8B.

Figure 8B:
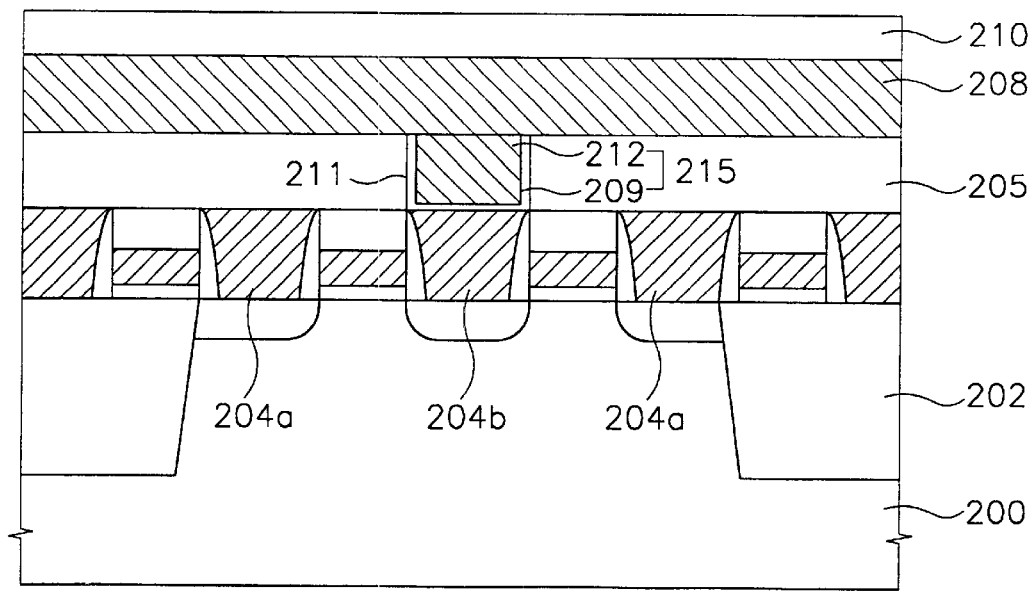

Referring now to FIG. 8B, which is a cross-sectional view taken along the line C–C' in FIG. 4. A barrier metal layer 209 is deposited on the bit line contact hole 211 and the first insulating layer 205. The barrier metal layer may be, for example, a Ti/TiN layer. A third metal layer 212 is deposited on the barrier metal layer 209. The third metal layer 212 may include, for example, tungsten. The third metal layer 212 is etched to partially or substantially expose the surface of the first insulating layer 205. A CMP process may also be used. Accordingly, a bit line plug 215 including the barrier metal layer 209 and the third metal layer 212 is formed in the bit line contact hole 211. The conductive layer 208 for the bit line including a fourth metal, such as tungsten, is deposited on the bit line plug 215 and on the first insulating layer 205. Accordingly, in some embodiments of the present invention, the bit line conductive layer 208 is fabricated as a single layer.

Figure 9A:
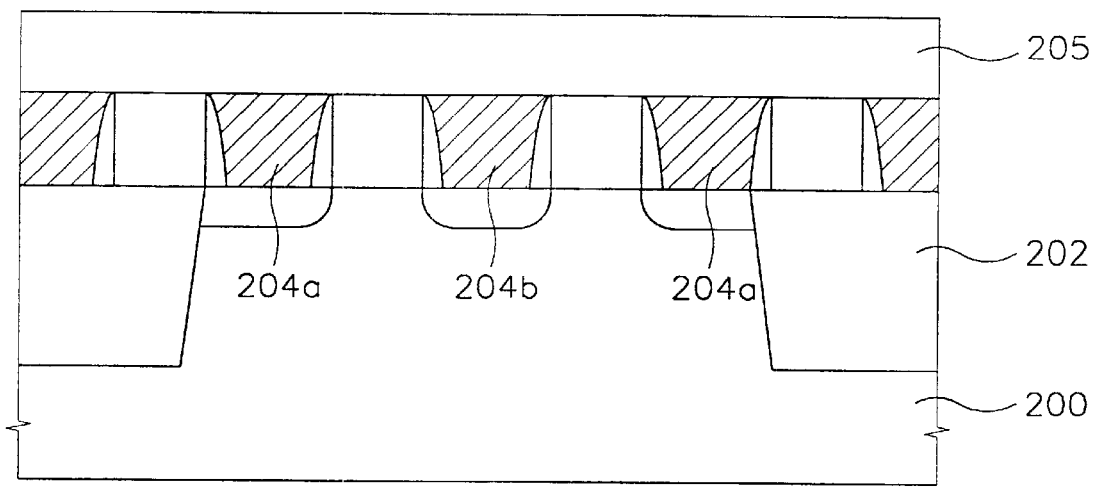
Figure 9B:
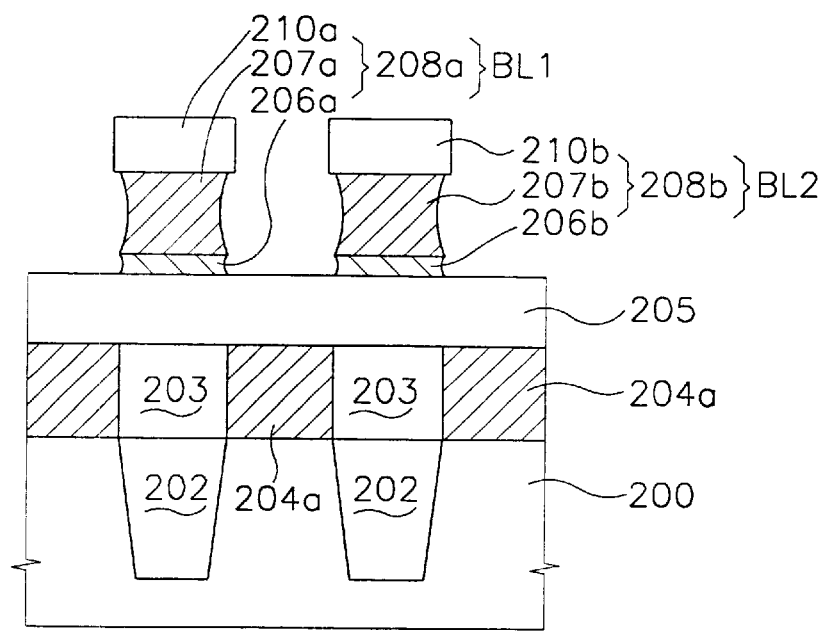

Referring now to FIGS. 9A and 9B, methods of fabricating the bit line structures BL1 and BL2 will be discussed. The second insulating layer 210 and the conductive layer 208 are etched using a first photoresist pattern (not shown) as an etching mask. Accordingly, a first bit line structure BL1 and a second bit line structure BL2 are provided. The first bit line structure BL1 has the first pattern 210a of the second insulating layer 210 and the first bit line 208a and the second bit line structure BL2 has the second pattern 210b of the second insulating layer 210 and the second bit line 208b. The first and second bit line structures BL1 and BL2 are spaced apart by a predetermined distance. The widths of the first and second bit line structures BL1 and BL2 are typically smaller than the widths of the first and second patterns 210a and 210b of the second insulating layer 210, respectively.

An anti-reflection layer (not shown) may be formed on the second insulating layer 210 to aid in the photolithography process. The anti-reflection layer is typically a single layer made of, for example, silicon oxynitride (SiON). Alternatively, the anti-reflection layer may include a composite layer of a high temperature oxide film and SiON film. The anti-reflection layer may reduce light from reflecting from the lower substrate when the following photolithography process is carried out.

Figure 10A:
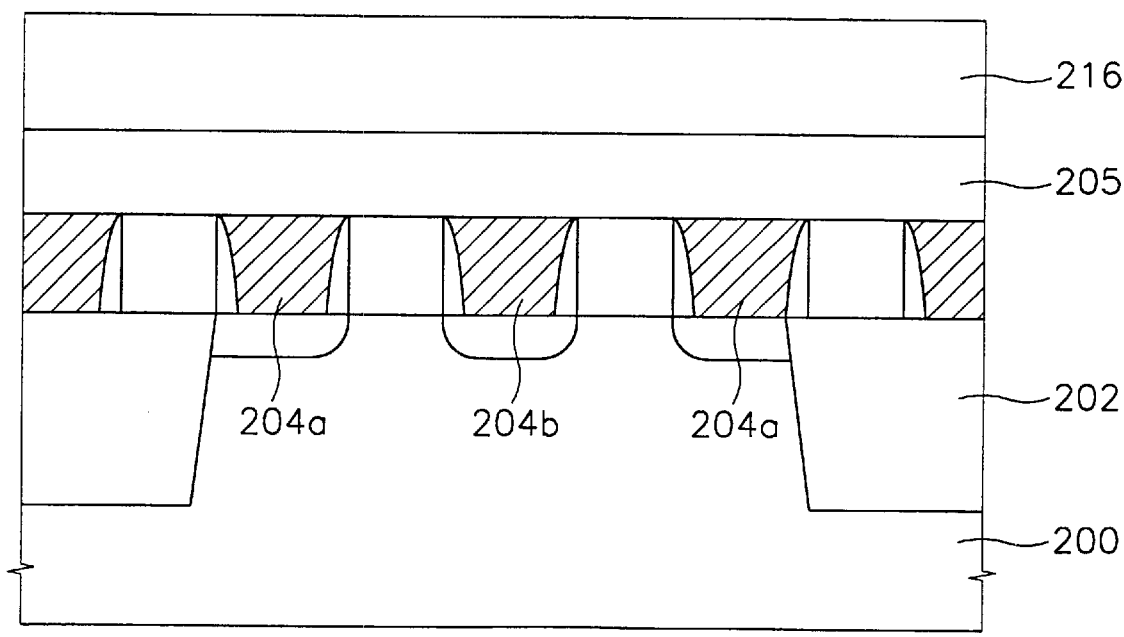
Figure 10B:
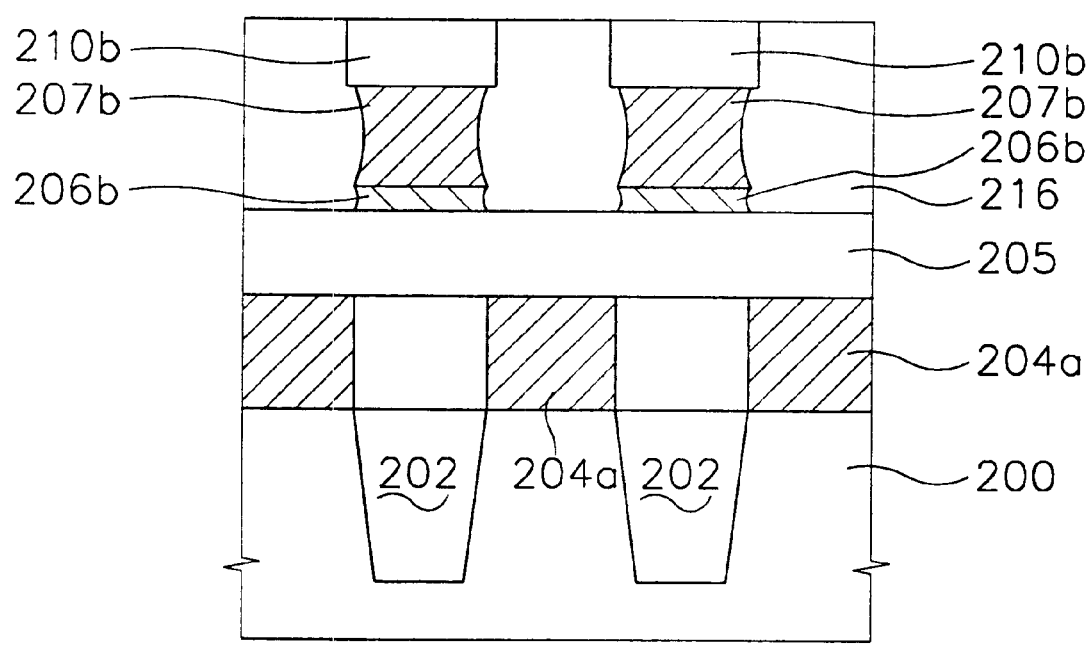

Referring now to FIGS. 10A and 10B, methods of forming an insulating layer 216 will be discussed. The first photoresist pattern is removed using, for example, ashing and stripping processes. The third insulating layer 216 is deposited on the surface of the resulting structure on which the first and second bit line structures BL1 and BL2 are formed. The third insulating layer 216 may include, for example, silicon oxide based material. In some embodiments of the present invention, the first and second bit lines 208a and 208b include tungsten. The third insulating layer 216 may be deposited using a high temperature oxide film which is deposited at the high temperature and/or using an oxide film such as BPSG and SOG which are required to perform a high temperature baking process after the deposition process. In embodiments employing tungsten, the tungsten may be oxidized exposing the side portions of the first and second bit lines 208a and 208b. Accordingly, in order to reduce the likelihood of exposing the bit lines, i.e. reduce the likelihood that the tungsten will oxidize, the third insulating layer 216 may be formed by using high density plasma (HDP) oxide film which can be deposited at a low temperature while burying the gap without creating voids.

The surface of the third insulating layer 216 is planarized by performing the CMP process. The second and fourth patterns 210a and 210b of the second insulating layer may be used as a stopper. Alternatively, if the optional anti-reflection layer is formed on the second insulating layer as discussed above, the CMP process can be carried out by using the anti-reflection layer as the stopper. The CMP process can be partially performed with respect to an upper portion of the first and second patterns 210a and 210b of the second insulating layer 210. Furthermore, the insulating layer 210 including, for example, silicon oxide based material, can be again deposited on the surface of the planarized third insulating layer 216 after performing the CMP process with respect to the first and second patterns 210a and 210b of the second insulating layer.

Figure 11B:
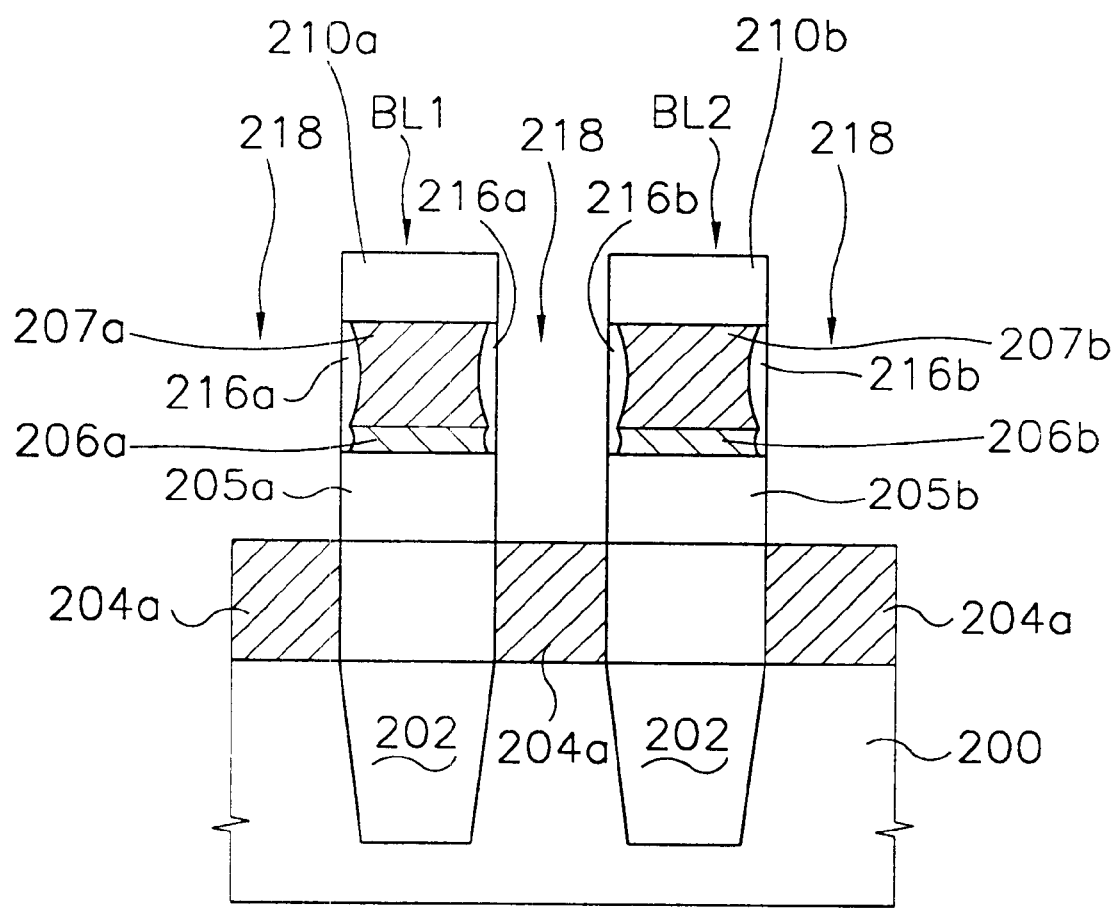

Referring now to FIGS. 11A and 11B, methods of forming the storage node contact hole 218 will be discussed. A second photoresist pattern 217 for defining the contact hole area is formed on the planarized third insulating layer 216 by, for example, performing a photo process. The second photoresist pattern 217 is formed in a line shape which is perpendicular to the first and second bit line structures BL1 and BL2. If the second photoresist pattern 217 has the line shape, the align margin can be increased when the photo process is carried out as compared with a hole type second photoresist pattern. In other words, if the hole type contact pattern is used, the layer surrounding the upper portion and the sidewall of the bit line may be deformed when the misalign occurs, thus causing the uniformity of the self-aligned contact forming process may be deteriorated. In contrast, if the contact pattern is formed in the line shape, the self-aligned contact forming process may be uniformly carried and may not be influenced by the misaligning problem.

The third and first insulating layers 216 and 205 are etched with the high etching selectivity with respect to the first and second patterns 210a and 210b of the second insulating layer. The second photoresist pattern 217 is used as the etching mask. Since the sidewall spacer does not exist on the sidewalls of the first and second bit lines 208a and 208b, the etching process can be carried out with a high etching selectivity condition. Accordingly, the storage node contact hole 218, which is self-aligned with respect to the first and second bit line structures BL1 and BL2, is formed. Simultaneously, the first residue 216a of the third insulating layer having the thickness corresponding to the width difference between the first pattern 210a of the second insulating layer and the first bit line remains at the sidewall of the first bit line structure BL1 in the storage node contact hole 218. Similarly, the second residue 216a of the third insulating layer having the thickness corresponding to the width difference between the second pattern 210b of the second insulating layer and the second bit line remains at the sidewall of the second bit line structure BL2.

Figure 12A:
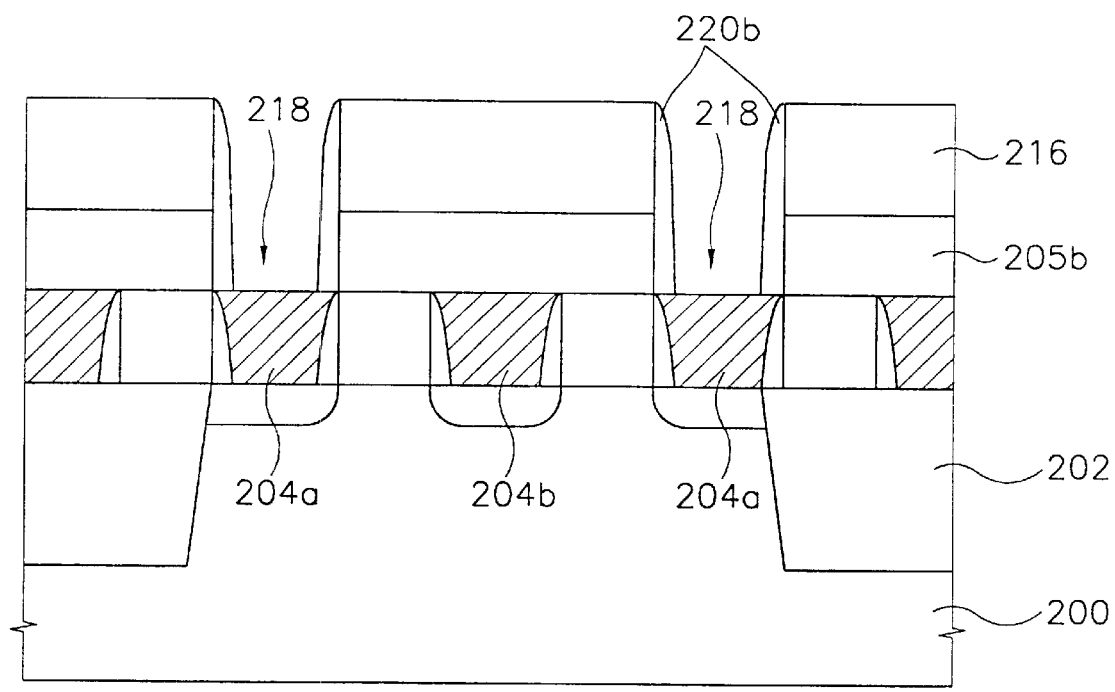
Figure 12B:
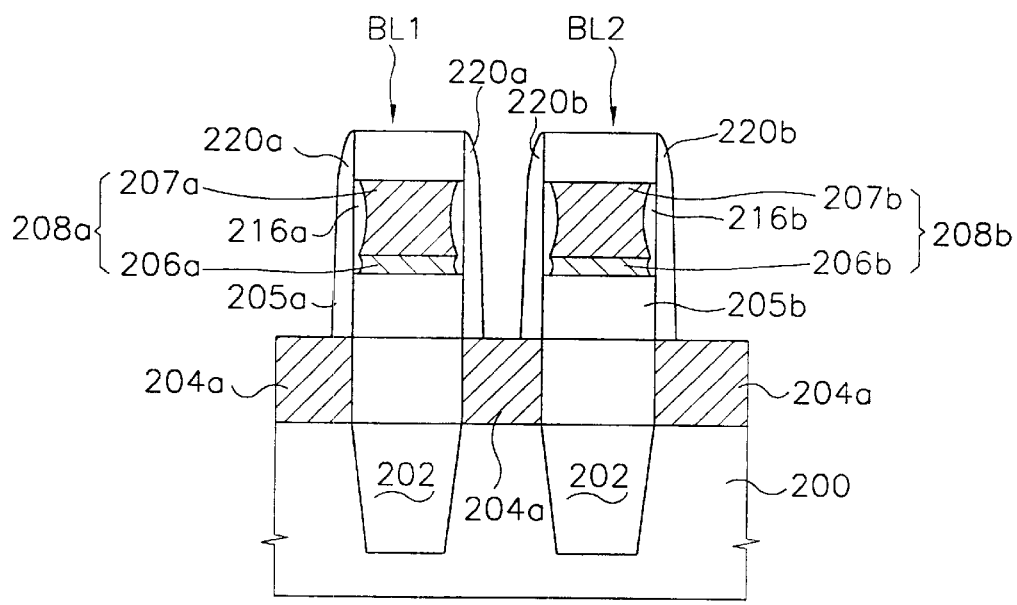

Referring now to FIGS. 12A and 12B, methods of forming first and second sidewall spacers 220a and 220b will be discussed. As discussed above, after forming the storage node contact hole 218, the ashing and stripping processes are carried out so as to remove the second photoresist pattern 217. The fourth insulating layer having the thickness of below about 400 Å is formed on the surface of the resulting structure. The fourth insulating layer is anisotropically etched.

Accordingly, the first sidewall spacer 220a is formed on the sidewall of the first residue 216a of the third insulating layer and on the sidewall of the first pattern 205a of the first insulating layer in the storage node contact hole 218. Similarly, the second sidewall spacer 220b is formed on the sidewall of the second residue 216b of the third insulating layer and on the sidewall of the second pattern 205b of the first insulating layer.

The fourth insulating layer is typically formed by using, for example, silicon oxide based material or silicon nitride based material, or may be a composite layer consisting of silicon oxide based material and silicon nitride based material. For example, oxide material, which is deposited at the low temperature and has a good step coverage on the stepped portion, may be used as the fourth insulating layer. Alternatively, the fourth insulating layer may be deposited by using a liquid phase deposition (LPD) process. As explained with reference to FIG. 3E, the fourth insulating layer may be formed by the method disclosed in an article by J. W. Klaus et al entitled *Atomic layer deposition of SiO$_2$ using catalyzed and uncatalyzed self-limiting surface reaction*. Surface Review and Letters, Volume 6, Nos. 3 & 4, pages 435–448. (1999).

Figure 13A:
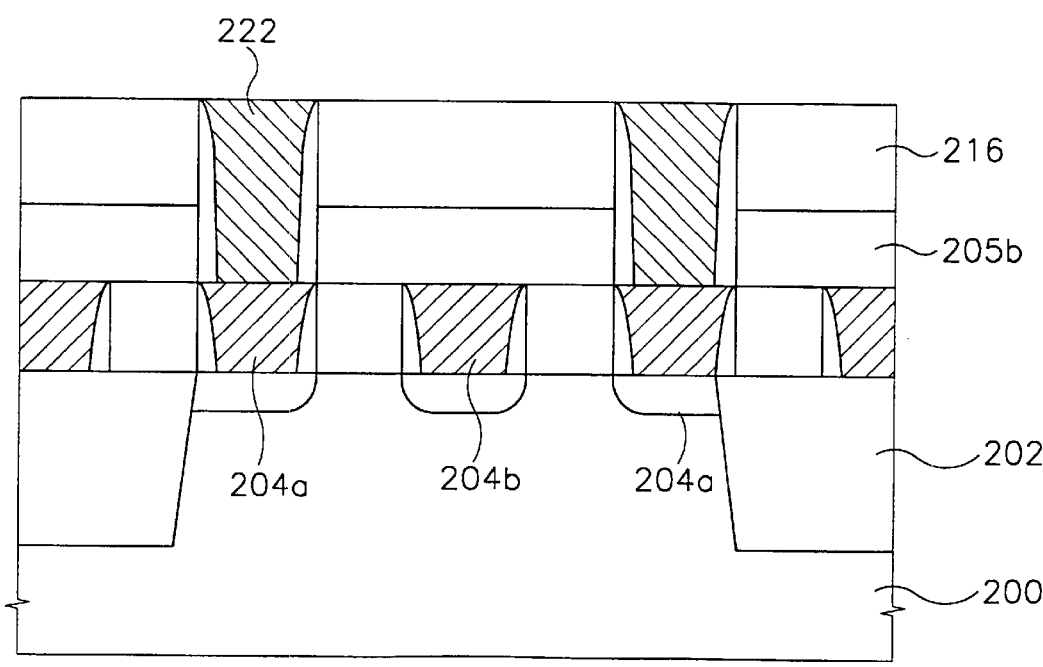
Figure 13B:
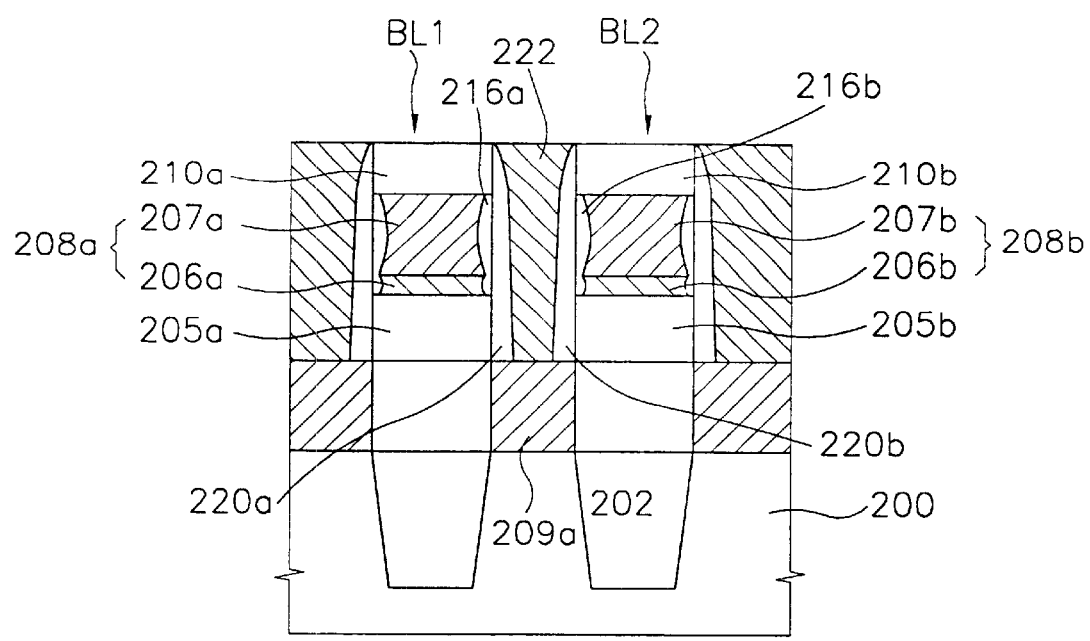

Referring now to FIGS. 13A and 13B, methods of forming the capacitor conductive layer 222 will be discussed. The capacitor conductive layer 222 is deposited using a chemical vapor deposition process. The capacitor conductive layer 222 may include, for example, a doped polysilicon layer. The capacitor conductive layer 222 may be removed to partially or substantially expose the upper surface of the third insulating layer 216 in such a manner that the capacitor conductive layer 222 remains substantially in the storage node contact hole 218. The capacitor conductive layer 222 may be removed by using an etch back method or a CMP process. The capacitor conductive layer 222 can be patterned as a storage electrode pattern using a photolithography process.

A capacitor (not shown) may be formed using processes known to those having skill in the art. The capacitor is electrically connected to the source region 205a through the storage node contact hole 218 and consists of the storage electrode, a dielectric film and a plate electrode.

As mentioned above, according to the embodiments of the present invention, the possibility that a bit line will be exposed may be reduced by the addition of the third insulating layer residue on the sidewall of the bit line. Furthermore, the thickness of the sidewall spacer surrounding the sidewall of the bit line may increase by the thickness of the residue, so the number of shorts between the bit line and the contact may also be reduced as well as the current leakage.

Since the sidewall spacer is formed on the sidewall of the bit line structures after forming the storage node contact hole using the self-aligned contact forming process, the sidewall spacer can be made of a silicon oxide based insulating layer having a low dielectric constant. Accordingly, the parasitic capacitance between the bit lines can be reduced, thereby possibly enhancing the operating speed of the device.

Furthermore, the photoresist pattern, i.e. contact pattern, used to form the storage node contact hole is formed in a line shape as opposed to a hole shape, thus, the aligning margin may be increased when the photo process is carried out and the process uniformity is improved.

As discussed above, the present invention provides integrated circuit devices providing improved short prevention and methods of fabricating the same. According to embodiments of the present invention, an insulating layer includes an overhanging portion that extends beyond the conductive layer. A sidewall insulating region, i.e. insulating layer residue, is disposed laterally in the space between the overhanging portion of the insulating layer and the microelectronic substrate. Accordingly, this sidewall insulating region may reduce the possibility that the conductive layer will be exposed when the contact hole is etched. Furthermore, the thickness of the sidewall spacer formed on the sidewall of the conductive layer increases by the thickness of the sidewall insulating region, thus, the current leakage generated in the conductive layer may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device comprising:
   a microelectronic substrate;
   a first conductive layer comprising a first material disposed on the microelectronic substrate;
   a second conductive layer disposed on the first conductive layer, the second conductive layer comprising a second material different from the first material;
   an insulating layer disposed on the second conductive layer, the insulating layer including an overhanging portion that extends beyond the first and second conductive layers; and
   a sidewall insulating region disposed laterally adjacent sidewalls of the first and second conductive layers and extending between the overhanging portion of the insulating layer and the microelectronic substrate.

2. The device according to claim 1, further comprising:
   an insulating region disposed between the overhanging portion of the insulating layer and the microelectronic substrate; and
   a sidewall spacer conforming to a sidewall of the insulating layer, the sidewall insulating region and an adjoining surface of the insulating region.

3. The device according to claim 1, wherein the overhanging portion extends a distance of from about 10 Å to about 100 Å beyond the conductive layer.

4. The device according to claim 2, wherein the sidewall insulating region extends from the sidewalls of the first and second conductive layers to the sidewall of the insulating layer.

5. The device according to claim 1, wherein the first conductive layer comprises a first metallic layer and the second conductive layer comprises a second metallic layer.

6. The device according to claim 5, wherein the first metallic layer comprises titanium (Ti) and the second metallic layer comprises tungsten (W).

7. A self-aligned contact structure for a microelectronic device, the structure comprising:
   a first conductive layer comprising a first material disposed on a microelectronic substrate;
   a second conductive layer disposed on the first conductive layer, the second conductive layer comprising a second material different from the first material;
   an insulating layer disposed on the second conductive layer, the insulating layer including an overhanging portion that extends beyond the first and second conductive layers;
   a sidewall insulating region disposed laterally adjacent sidewalls of the first and second conductive layers and extending between the overhanging portion of the insulating layer and the microelectronic substrate; and
   a conductive region disposed laterally adjacent the sidewall insulating region such that the sidewall insulating region separates the sidewalls of the first and second conductive layers and the conductive region.

8. The structure according to claim 7, further comprising:
   an insulating region disposed between the overhanging portion of the insulating layer and the microelectronic substrate; and
   an insulating sidewall spacer conforming to a sidewall of the insulating layer, the sidewall insulating region and an adjoining surface of the insulating region, wherein the conductive region is disposed laterally adjacent the insulating sidewall spacer.

9. The structure according to claim 7, wherein the overhanging portion extends a distance of from about 10 Å to about 100 Å beyond the conductive layer.

10. The structure according to claim 8, wherein the sidewall insulating region extends from the sidewalls of the first and second conductive layers to the sidewall of the insulating layer.

11. The structure according to claim 7, wherein the first conductive layer comprises a first metallic layer and the second conductive layer comprises a second metallic layer.

12. The structure according to claim 11, wherein the first metallic layer comprises titanium (Ti) and the second metallic layer comprises tungsten (W).

13. An integrated circuit memory device, comprising:
    a first bit line comprising:
       a first conductive layer comprising a first material disposed on a microelectronic substrate;
       a second conductive layer on the first conductive layer, the second conductive layer comprising a second material different from the first material;
       a first insulating layer disposed on the second conductive layer, the first insulating layer including a first overhanging portion that extends beyond the first and second conductive layers; and
       a first sidewall insulating region disposed laterally adjacent sidewalls of the first and second conductive layers and extending between the first overhanging portion of the first insulating layer and the microelectronic substrate; and
    a second bit line comprising:
       a third conductive layer comprising a third material disposed on a microelectronic substrate;
       a fourth conductive layer on the third conductive layer, the fourth conductive layer comprising a fourth material different from the third material;
       a second insulating layer disposed on the fourth conductive layer, the second insulating layer including a second overhanging portion that extends beyond the third and fourth conductive layers; and
       a second sidewall insulating region disposed laterally adjacent sidewalls of the third and fourth conductive layers and extending between the second overhanging portion of the second insulating layer and the microelectronic substrate.

14. The memory device according to claim 13:
    wherein the first bit line further comprises:
       a first insulating region disposed between the first overhanging portion of the first insulating layer and the microelectronic substrate; and
       a first sidewall spacer conforming to a sidewall of the first insulating layer, the first sidewall insulating region and an adjoining surface of the first insulating region; and
    wherein the second bit line further comprises:
       a second insulating region disposed between the second overhanging portion of the second insulating layer and the microelectronic substrate; and
       a second sidewall spacer conforming to a sidewall of the second insulating layer, the second sidewall insulating region and an adjoining surface of the second insulating region.

15. The memory device according to claim 13:

wherein the first overhanging portion extends a distance of from about 10 Å to about 100 Å beyond the first and second conductive layers; and wherein the second overhanging portion extends a distance of from about 10 Å to about 100 Å beyond the third and fourth conductive layers.

16. The memory device according to claim 14:

wherein the first sidewall insulating region extends from the sidewalls of the first and second conductive layers to the sidewall of the first insulating layer; and wherein the second sidewall insulating region extends from the sidewalls of the third and fourth conductive layers to the sidewall of the second insulating layer.

17. The memory device according to claim 13:

wherein the first conductive layer comprises a first metallic layer and the second conductive layer comprises a second metallic layer; and wherein the third conductive layer comprises a third metallic layer and the fourth conductive layer comprises a fourth metallic layers.

18. The memory device according to claim 17, wherein the first and third metallic layers comprises titanium (Ti) and wherein the second and fourth metallic layers comprises tungsten (W).

* * * * *

UNITED STATES PATENT AND TRADEMARK OFFICE
CERTIFICATE OF CORRECTION

PATENT NO. : 6,680,511 B1  
DATED : January 20, 2004  
INVENTOR(S) : Kim et al.

It is certified that error appears in the above-identified patent and that said Letters Patent is hereby corrected as shown below:

<u>Column 16,</u>  
Line 8, should read -- ... a fourth metallic layer. --

Signed and Sealed this

Fifteenth Day of June, 2004

JON W. DUDAS  
*Acting Director of the United States Patent and Trademark Office*